(12) United States Patent
Lei et al.

(10) Patent No.: US 10,316,407 B2
(45) Date of Patent: Jun. 11, 2019

(54) COMPOSITIONS AND METHODS USING SAME FOR DEPOSITION OF SILICON-CONTAINING FILMS

(71) Applicant: VERSUM MATERIALS US, LLC, Tempe, AZ (US)

(72) Inventors: Xinjian Lei, Vista, CA (US); Moo-Sung Kim, Gyunggi-Do (KR); Matthew R. MacDonald, Laguna Niguel, CA (US); Manchao Xiao, San Diego, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/520,330

(22) PCT Filed: Oct. 23, 2015

(86) PCT No.: PCT/US2015/057045
§ 371 (c)(1),
(2) Date: Apr. 19, 2017

(87) PCT Pub. No.: WO2016/065221
PCT Pub. Date: Apr. 28, 2016

(65) Prior Publication Data
US 2017/0338109 A1    Nov. 23, 2017

Related U.S. Application Data

(60) Provisional application No. 62/068,248, filed on Oct. 24, 2014.

(51) Int. Cl.
*H01L 21/02* (2006.01)
*C23C 16/34* (2006.01)
(Continued)

(52) U.S. Cl.
CPC .......... *C23C 16/401* (2013.01); *C23C 16/345* (2013.01); *C23C 16/36* (2013.01);
(Continued)

(58) Field of Classification Search
CPC ................ C23C 16/345; C23C 16/401; C23C 16/45542; C23C 16/45553;
(Continued)

(56) References Cited

U.S. PATENT DOCUMENTS

| 4,200,666 A | 4/1980 | Reinberg |
| 4,950,381 A | 8/1990 | Takeuchi et al. |

(Continued)

FOREIGN PATENT DOCUMENTS

| EP | 0218117 A2 | 4/1987 |
| EP | 0218117 A3 | 4/1987 |

(Continued)

OTHER PUBLICATIONS

International Search Report and Written Opinion dated Feb. 25, 2016 by the European Patent Office for counterpart international patent application No. PCT/US2015/057045.

(Continued)

*Primary Examiner* — Mary A Wilczewski
(74) *Attorney, Agent, or Firm* — Joseph D. Rossi

(57) ABSTRACT

Described herein are compositions and methods using same for forming a silicon-containing film or material such as without limitation a silicon oxide, silicon nitride, silicon oxynitride, a carbon-doped silicon nitride, or a carbon-doped silicon oxide film in a semiconductor deposition process, such as without limitation, a plasma enhanced atomic layer deposition of silicon-containing film.

11 Claims, 3 Drawing Sheets

(51) Int. Cl.
  *C23C 16/36* (2006.01)
  *C23C 16/40* (2006.01)
  *C23C 16/48* (2006.01)
  *C23C 16/50* (2006.01)

(52) U.S. Cl.
  CPC .............. *C23C 16/48* (2013.01); *C23C 16/50* (2013.01); *H01L 21/0228* (2013.01); *H01L 21/0234* (2013.01); *H01L 21/02126* (2013.01); *H01L 21/02164* (2013.01); *H01L 21/02211* (2013.01); *H01L 21/02216* (2013.01); *H01L 21/02219* (2013.01); *H01L 21/02222* (2013.01); *H01L 21/02271* (2013.01); *H01L 21/02274* (2013.01); *H01L 21/02326* (2013.01); *H01L 21/02337* (2013.01); *H01L 21/02348* (2013.01)

(58) Field of Classification Search
  CPC ... C23C 16/45578; C23C 16/36; C23C 16/48; C23C 16/50; C23C 14/0021; H01L 21/02326; H01L 21/02337; H01L 21/0234; H01L 21/02348; H01L 21/02123; H01L 21/02126; H01L 21/02164; H01L 21/02175; H01L 21/0217; H01L 21/0228; H01L 21/02211; H01L 21/02216; H01L 21/02219; H01L 21/02222; H01L 21/02271; H01L 21/02274
  See application file for complete search history.

(56) References Cited

U.S. PATENT DOCUMENTS

| | | |
|---|---|---|
| 5,008,422 A | 4/1991 | Blum et al. |
| 5,567,661 A | 10/1996 | Nishio et al. |
| 6,197,658 B1 | 3/2001 | Jang |
| 7,074,690 B1 | 7/2006 | Gauri et al. |
| 7,498,273 B2 | 3/2009 | Mallick et al. |
| 7,521,378 B2 | 4/2009 | Fucsko et al. |
| 7,557,420 B2 | 7/2009 | Fucsko et al. |
| 7,582,555 B1 | 9/2009 | Lang et al. |
| 7,825,040 B1 | 11/2010 | Fukazawa et al. |
| 7,888,233 B1 | 2/2011 | Gauri et al. |
| 7,915,131 B2 | 3/2011 | Nakagawa et al. |
| 8,227,032 B2 | 7/2012 | Dussarrat et al. |
| 8,481,403 B1 | 7/2013 | Gauri et al. |
| 8,575,040 B2 | 11/2013 | Fucsko et al. |
| 8,580,697 B1 | 11/2013 | Lang et al. |
| 8,685,867 B1 | 4/2014 | Danek et al. |
| 8,871,656 B2* | 10/2014 | Mallick ............ H01L 21/02164 257/E21.24 |
| 9,190,299 B2* | 11/2015 | Wada ................ H01L 21/02238 |
| 9,243,324 B2* | 1/2016 | Bowen ................ C23C 16/325 |
| 9,586,979 B2* | 3/2017 | Jang .......................... C07F 7/10 |
| 9,777,025 B2* | 10/2017 | Girard ..................... C07F 7/025 |
| 9,905,415 B2* | 2/2018 | Chandra ............. H01L 21/0217 |
| 2005/0025885 A1* | 2/2005 | McSwiney ............ C23C 16/345 427/248.1 |
| 2005/0109276 A1* | 5/2005 | Iyer ...................... C23C 16/345 118/715 |
| 2005/0267253 A1 | 12/2005 | Hayashi |
| 2007/0031598 A1 | 2/2007 | Okuyama et al. |
| 2007/0116968 A1 | 5/2007 | Dierdorf et al. |
| 2007/0275568 A1 | 11/2007 | Miyoshi et al. |
| 2007/0281495 A1 | 12/2007 | Mallick et al. |
| 2008/0305648 A1 | 12/2008 | Fukazawa et al. |
| 2009/0191722 A1 | 7/2009 | Hasebe et al. |
| 2009/0232985 A1 | 9/2009 | Dussarrat et al. |
| 2010/0081293 A1 | 4/2010 | Mallick et al. |
| 2010/0164057 A1 | 7/2010 | Hunks et al. |
| 2011/0053345 A1 | 3/2011 | Hanaoka et al. |
| 2011/0165781 A1 | 7/2011 | Liang et al. |
| 2011/0215445 A1 | 9/2011 | Yang et al. |
| 2012/0071006 A1 | 3/2012 | Kang |
| 2012/0083133 A1 | 4/2012 | Solis et al. |
| 2012/0148745 A1 | 6/2012 | Xiao et al. |
| 2012/0213940 A1 | 8/2012 | Mallick |
| 2012/0220139 A1 | 8/2012 | Lee et al. |
| 2013/0230987 A1 | 9/2013 | Draeger et al. |
| 2013/0260575 A1 | 10/2013 | Al-Rashid et al. |
| 2013/0323435 A1 | 12/2013 | Xiao et al. |
| 2014/0030448 A1* | 1/2014 | Bowen ................ C23C 16/325 427/578 |
| 2014/0051264 A1* | 2/2014 | Mallick ............ H01L 21/02164 438/786 |
| 2014/0073144 A1 | 3/2014 | Chatterjee et al. |
| 2014/0256160 A1 | 9/2014 | Wada et al. |
| 2015/0021599 A1* | 1/2015 | Ridgeway ............ C23C 16/345 257/43 |
| 2015/0099375 A1* | 4/2015 | Haripin ................ C23C 14/027 438/793 |
| 2015/0376211 A1* | 12/2015 | Girard .................... C07F 7/025 428/447 |
| 2016/0122369 A1* | 5/2016 | Jang .......................... C07F 7/10 556/412 |
| 2016/0280724 A1* | 9/2016 | Arkles ................. C01B 21/068 |
| 2017/0114465 A1* | 4/2017 | Kalutarage ........... C23C 16/345 |
| 2017/0335449 A1* | 11/2017 | Li .......................... C23C 16/36 |
| 2017/0338109 A1* | 11/2017 | Lei ......................... C23C 16/36 |

FOREIGN PATENT DOCUMENTS

| | | | | |
|---|---|---|---|---|
| EP | 0 857 700 | * | 8/1998 | ............ C03C 17/22 |
| EP | 1119035 A2 | | 7/2001 | |
| EP | 1119035 A3 | | 7/2001 | |
| EP | 1811056 A1 | | 7/2007 | |
| EP | 2669248 A1 | | 12/2013 | |
| JP | 61-234534 | * | 10/1986 | ........... H01L 21/318 |
| JP | 04329639 | | 11/1992 | |
| JP | 06310493 | | 4/1994 | |
| JP | 07115092 A | | 5/1995 | |
| JP | 2011511881 | | 4/2011 | |
| JP | 2012504867 | | 2/2012 | |
| JP | 2012124492 A | | 6/2012 | |
| JP | 2012169658 | | 9/2012 | |
| JP | 201370077 | | 4/2013 | |
| JP | 2013545284 | | 12/2013 | |
| JP | 2014013889 A | | 1/2014 | |
| JP | 2014132653 A | | 7/2014 | |
| KR | 2014087903 | * | 7/2014 | ............. C08G 77/26 |
| KR | 2014087908 | * | 7/2014 | ............. C08G 77/26 |
| KR | 20140087903 A | | 7/2014 | |
| WO | WO 02/17374 | * | 2/2002 | ........... H01L 21/318 |
| WO | 2005/093126 A1 | | 10/2005 | |
| WO | WO 2017/026676 | * | 2/2017 | ........... C23C 16/455 |
| WO | WO 2017/147150 | * | 8/2017 | ............. C23C 16/30 |

OTHER PUBLICATIONS

Kim et al., "Novel Flowable CVD Process Technology for sub-20nm Interlayer Dielectrics" Interconnect Technology Conference (IITC) 2012 IEEE International, San Jose, CA (3 pages).

Ogata et al., "Oxidation of Porous Silicon Under Water Vapor Environment" Journal of the Electrochemical Society, vol. 142, No. 5, May 1995, pp. 1595-1601.

Scantlin and Norman, "The Borane-Catalyzed Condensation of Trisilazane and N-Methyldisilazane" Inorganic Chemistry, vol. 11, No. 12, 1972, pp. 3082-3084.

Wells and Schaeffer, "Studies of Silicon-Nitrogen Compounds. The Base-Catalyzed Elimination of Silane from Trisilylamine" Journal of the American Chemical Society, vol. 88, No. 1, Jan. 5, 1966, pp. 37-42.

Marcus, Lawrence, et al., "Formation of Fluorosilylamines by the interacton of trisilylamine with phosphorus pentafluoride," Inorganic Chemistry, vol. 14, No. 12, Jan. 1, 1975, pp. 3124-3125.

McKean, D. C., et al., "infrared studies of sih bonds and the structure of methylsilylamines and ethers," Chemistry—A European Journal, vol. 49a, No. 8, Jan. 1, 1993, pp. 1095-1104.

(56) References Cited

OTHER PUBLICATIONS

Vishnevskiy, V., et al., "Molecular structure of tris(cyclopropylsilyl)amine as determined by gas electron diffraction and quantum-chemical calculations," Journal of Molecular Structure, Elsevier, Amsterdam, NL, vol. 889, No. 1-3, Oct. 29, 2008, pp. 316-327.
Schaeffer, Riley, et al., "Chemical Abstracts—CAPLUS database" In: "Studies of lightweight elements," Apr. 22, 2001, pp. 1-47.
Brodie et al., "An NMR Study of the Step by Step Pyrolysis of a Polysilazane Precursor of Silicon Nitride" Inorg. Chem. 32, 1993, 4646-4649.
Hu et al., "Synthesis and characterization of polysilazane precursor" Journal of Materials Science Letters 18 (1999) 1271-1272.

* cited by examiner

COMPOSITIONS AND METHODS USING SAME FOR DEPOSITION OF SILICON-CONTAINING FILMS

CROSS REFERENCE TO RELATED APPLICATIONS

This Application claims the benefit of Application No. 62/068,248, filed on Oct. 24, 2014. The disclosure of Application No 62/068,248 is hereby incorporated by reference.

BACKGROUND OF THE INVENTION

Described herein is a process and a composition for the fabrication of an electronic device. More specifically, described herein are compositions for forming a silicon-containing film in a plasma enhanced atomic layer deposition (PEALD) process. Exemplary silicon-containing films that can be deposited using the compositions and methods described herein include, without limitation, stoichiometric or non-stoichiometric, silicon nitride, silicon carbonitride, silicon oxynitride, silicon aluminum nitride, silicon oxide, and silicon carboxide films.

Silicon nitride is often used as an insulator and chemical barrier in manufacturing integrated circuits, to electrically isolate different structures or as an etch mask in bulk micromachining. As a passivation layer for microchips, it is superior to silicon dioxide, as it is a significantly better diffusion barrier against water molecules and sodium ions, two major sources of corrosion and instability in microelectronics. It is also used as a dielectric between polysilicon layers in capacitors in analog chips.

One of the commercial methods for forming silicon nitride or films employs dichlorosilane and ammonia as the precursor reactants. Low pressure chemical vapor deposition (LPCVD) using precursors such as dichlorosilane and ammonia require high deposition temperatures to get the best film properties. For example, temperatures greater than 750° C. may be required to obtain reasonable growth rates and uniformities. Other processing issues involve the hazardous aspects of chlorine and chlorine byproducts.

Many of the newer semiconductor devices require silicon nitride films that have low etch rates, high film stresses, or both. It is also preferred, and sometimes necessary, that the films be formed at temperatures below 600° C. while maintaining good electrical characteristics. Film hardness is yet another factor to consider in the design of the electrical components and the silicon nitride films do offer extremely hard films.

The deposition of conformal, stoichiometric and non-stoichiometric silicon nitride films at low temperature, e.g., temperatures of about 500° C. or less or about 400° C. or less, which meet one or more criteria to be considered a high quality film, has been a long-standing industry challenge. There are several applications in semiconductor field such as advanced patterning or spacer which require high quality films. A silicon nitride film is considered a "high quality" film if it has one or more of the following characteristics: a density of 2.0 grams per cubic centimeter (g/cc) or greater, a low wet etch rate (as measured in dilute hydrofluoric acid (HF)), and combinations thereof compared to other silicon nitride films. In these or other embodiments, the refractive index for the silicon nitride film should be 1.8 or greater.

Accordingly, there is a need in the art to provide a low temperature (e.g., processing temperature of about 500° C. or less) method for depositing a conformal, high quality, silicon nitride film wherein the film has one or more of the following characteristics: a reflective index of 1.8 or higher, a density of 2.0 grams per cubic centimeter (g/cc) or greater, a low wet etch rate (as measured in dilute hydrofluoric acid (HF)), and combinations thereof compared to other silicon nitride films using other deposition methods or precursors.

BRIEF SUMMARY OF THE INVENTION

Described herein are methods and compositions for forming stoichiometric or non-stoichiometric silicon nitride films, which may further comprise carbon, oxygen, or combinations thereof, onto at least a portion of a substrate. In one aspect, the composition for depositing a silicon nitride film comprises: at least one silicon precursor compound selected from the group consisting of:

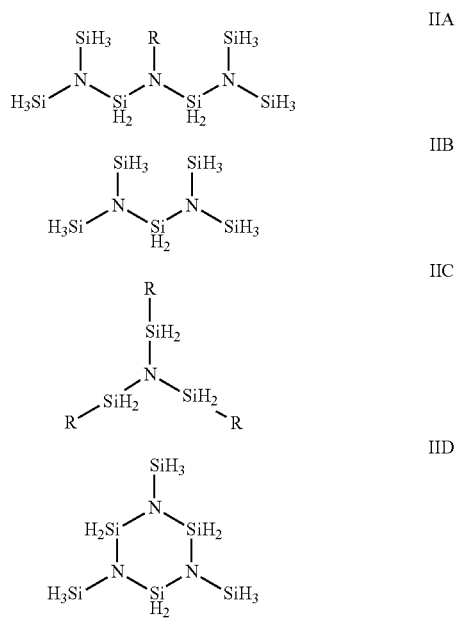

wherein substituent R is independently selected from a hydrogen, a halide atom, a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group. In an alternative embodiment, the silicon precursor compound described herein having Formulae IIA through IID can be used to deposit other silicon-containing films or materials such as, without limitation, silicon oxide films.

In another aspect, there is provided a composition for forming a silicon-containing material comprising: (a) at least one silicon precursor compound selected from the group consisting of:

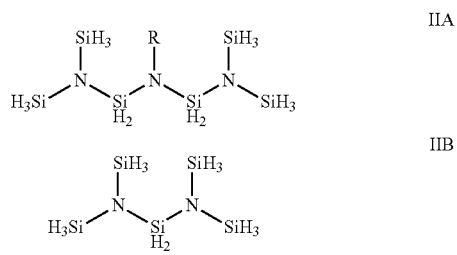

-continued

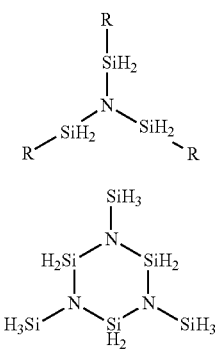

IIC

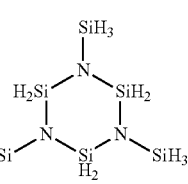

IID wherein substituent R is independently selected from a hydrogen, a halide atom, a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group; and (b) a solvent, wherein the solvent has a boiling point and wherein the difference between the boiling point of the solvent and that of the at least one precursor compound is 40° C. or less, and wherein the composition is substantially free of halide ions. In certain embodiments of the composition described herein, exemplary solvent(s) can include, without limitation, ether, tertiary amine, alkyl hydrocarbon, aromatic hydrocarbon, tertiary aminoether, and combinations thereof.

In another aspect, there is provided a method for depositing a silicon nitride film, the method comprising:
  a. placing one or more substrates into a reactor;
  b. introducing at least one silicon precursor compound selected from the group consisting of:

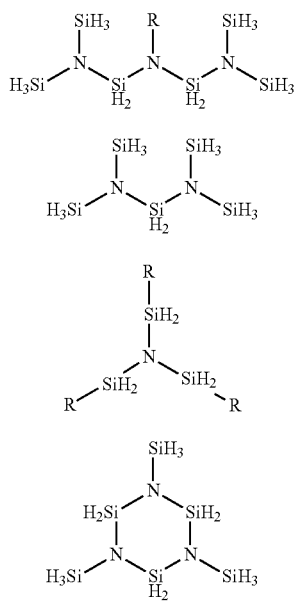

wherein substituent R is independently selected from a hydrogen, a halide atom, a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group wherein at least a portion of the compound reacts under processing conditions sufficient to provide a chemisorbed layer;
  c. purging the reactor with a purge gas;
  d. introducing a plasma source comprising nitrogen into the reactor to react with at least a portion of the chemisorbed layer wherein the plasma is generated at a power density ranging from about 0.01 to about 1.5 W/cm²; and
  e. optionally purge the reactor with an inert gas; and wherein the steps b through e are repeated until a desired thickness of the silicon nitride film is obtained.

DETAILED DESCRIPTION OF THE INVENTION

Figure 1:
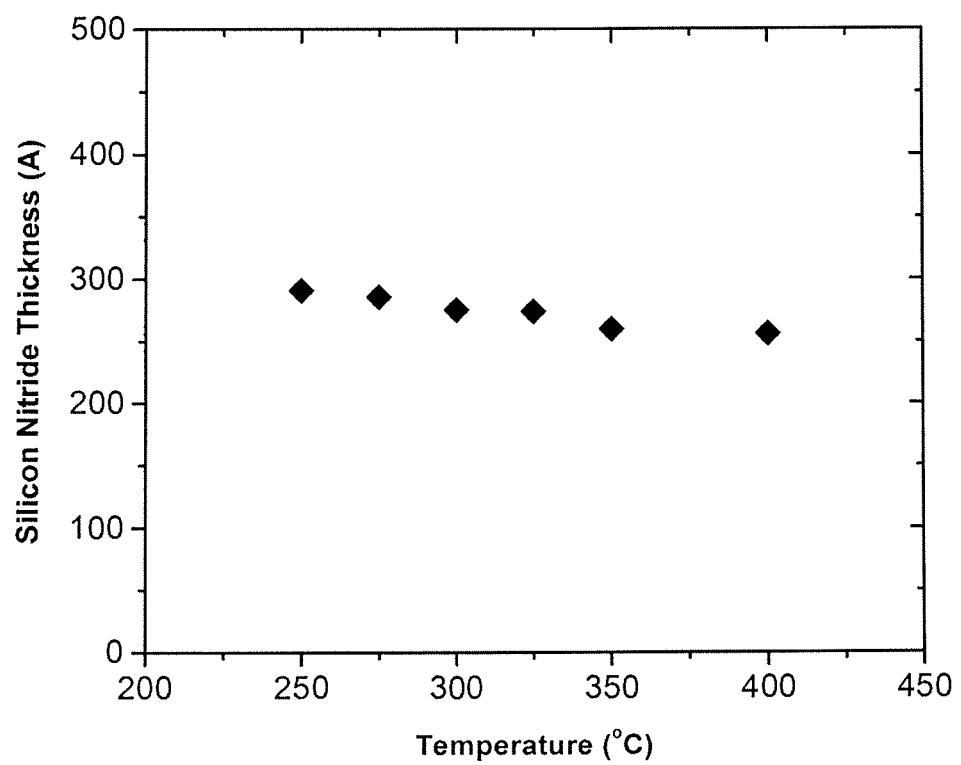
FIG. 1 provides the relationship between silicon nitride film thickness measured in Angstroms (Å) and temperature of the plasma enhanced atomic layer deposition of silicon nitride using the Formula IIB precursor compound and method described in Example 2.

The deposition of conformal, stoichiometric and non-stoichiometric silicon nitride films at low temperatures, e.g., temperatures of 500° C. or less or 400° C. or less, which meet one or more criteria to be considered a high quality film, has been a long-standing industry challenge. Throughout the description, the term "silicon nitride" as used herein refers to a film comprising silicon and nitrogen selected from the group consisting of stoichiometric or non-stoichiometric silicon nitride, silicon carbonitride, silicon carboxynitride, silicon aluminum nitride and there mixture thereof. A silicon nitride film is considered a "high quality" film if it has one or more of the following characteristics: a density of 2.0 grams per cubic centimeter (g/cc) or greater, a low wet etch rate (as measured in dilute hydrofluoric acid (HF)), and combinations thereof compared to other silicon nitride films. In these or other embodiments, the refractive index for the silicon nitride film should be 1.8 or higher. In one embodiment, described herein is composition for forming a silicon-containing film or material using silicon precursor compounds having Formulae IIA through IID. Also described herein is an atomic layer deposition (ALD) or ALD-like method that deposits a silicon nitride film at a low temperature, or one or more deposition temperatures ranging from about 20° C. to about 500° C., using the Formula IIA through IID described herein in a plasma process which comprises nitrogen and optionally a noble or inert gas.

Described herein are methods for forming a stoichiometric or non-stoichiometric silicon nitride film comprising silicon and nitrogen onto at least a portion of a substrate. In certain embodiments, the silicon nitride film may further comprise carbon. In certain embodiments, the silicon nitride film may further comprise aluminum such as a silicon aluminum nitride film. In certain embodiments, the silicon nitride film further comprises oxygen such as a silicon oxynitride film. In this or other embodiments, the silicon nitride film comprises oxygen and carbon such as a silicon carboxynitride film.

In alternative embodiments, the composition comprising at least one silicon precursor compound having Formulae IIA through IID may be used to deposit a silicon oxide material or film. Throughout the description, the term "silicon oxide" as used herein refers to a film comprising silicon and nitrogen selected from the group consisting of stoichiometric or non-stoichiometric silicon oxide, carbon doped silicon oxide, silicon carboxynitride and mixtures thereof.

The silicon nitride films described herein are deposited using at least one silicon precursor compound represented by Formulae IIA through IID below:

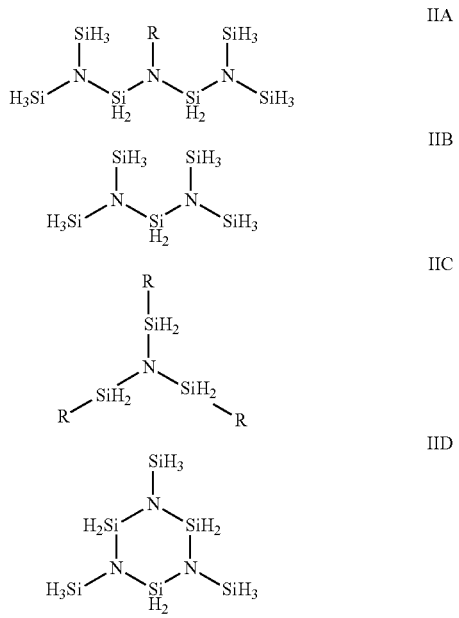

wherein substituent R is independently selected from a hydrogen, a halide atom, a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkynyl group; a linear or branched $C_3$ to $C_{12}$ alkynyl group; a $C_4$ to $C_{10}$ cyclic alkyl group; and a $C_6$ to $C_{10}$ aryl group.

While not being bound by theory, it is believed that the silicon precursor compounds having three or more Si—N bonds, and optionally three or more Si—$H_3$ groups in Formula IIA, IIB and IID, are more reactive towards at least a portion of the substrate surface, thus anchoring more silicon fragments on the surface during the deposition process. This in turn will increase the growth rate of the film as well as provide better surface coverage for substrate comprising surface features, such as without limitation, pores, trenches, and/or vias, thereby allowing for the deposition of a conformal silicon nitride or other silicon-containing film on the surface. An example of a Formula IIB compound is bis(disilylamino)silane (aka N,N'-disilyltrisilazane). An example of a Formula IIC compound is tris (ethylsillyl) amine. In embodiments wherein the silicon precursor compound is tris(ethylsillyl)amine, it is believed that the ethylene acts as leaving group in the deposition process thereby creating additional Si reactive sites while at the same time lowering the Si—H content in the precursor.

In Formulae IIA through IID above and throughout the description, the term "linear alkyl" denotes a linear functional group having from 1 to 10, 3 to 10, or 1 to 6 carbon atoms. Exemplary linear alkyl groups include, but are not limited to, methyl, ethyl, propyl, butyl, pentyl, and hexyl groups. In the formula IIA through IID above and throughout the description, the term "branched alkyl" denotes a branched functional group having from 3 to 10, or 1 to 6 carbon atoms. Exemplary branched alkyl groups include, but are not limited to, isopropyl, isobutyl, sec-butyl, tert-butyl, iso-pentyl, tert-pentyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In Formulae IIA through IID above and throughout the description, the term "halide" denotes a chloride, bromide, iodide, or fluoride ion.

In Formulae IIA through IID above and throughout the description, the term "cyclic alkyl" denotes a cyclic group having from 3 to 10 or 5 to 10 atoms. Exemplary cyclic alkyl groups include, but are not limited to, cyclobutyl, cyclopentyl, cyclohexyl, and cyclooctyl groups. In certain embodiments, the cyclic alkyl group may have one or more $C_1$ to $C_{10}$ linear, branched substituents, or substituents containing oxygen or nitrogen atoms. In this or other embodiments, the cyclic alkyl group may have one or more linear or branched alkyls or alkoxy groups as substituents, such as, for example, a methylcyclohexyl group or a methoxycyclohexyl group.

In Formulae IIA through IID above and throughout the description, the term "aryl" denotes an aromatic cyclic functional group having from 3 to 10 carbon atoms, from 5 to 10 carbon atoms, or from 6 to 10 carbon atoms. Exemplary aryl groups include, but are not limited to, phenyl, benzyl, chlorobenzyl, tolyl, and o-xylyl.

In Formulae IIA through IID above and throughout the description, the term "alkenyl group" denotes a group which has one or more carbon-carbon double bonds and has from 2 to 12, from 2 to 10, or from 2 to 6 carbon atoms. Exemplary alkenyl groups include, but are not limited to, vinyl or allyl groups.

In Formulae IIA through IID above and throughout the description, the term "alkynyl group" denotes a group which has one or more carbon-carbon triple bonds and has from 2 to 12 or from 2 to 6 carbon atoms.

In Formulae IIA through IID above and throughout the description, the term "unsaturated" as used herein means that the functional group, substituent, ring or bridge has one or more carbon double or triple bonds. An example of an unsaturated ring can be, without limitation, an aromatic ring such as a phenyl ring. The term "saturated" means that the functional group, substituent, ring or bridge does not have one or more double or triple bonds.

In certain embodiments, one or more of the alkyl group, alkenyl group, alkynyl group, alkoxysilylalkyl group, alkoxy group, aryloxy, aroyloxy, aryl group, and/or aromatic group in the formulae may be "substituted" or have one or more atoms or group of atoms substituted in place of, for example, a hydrogen atom. Exemplary substituents include, but are not limited to, oxygen, sulfur, halogen atoms (e.g., F, Cl, I, or Br), nitrogen, alkyl groups, and phosphorous. In other embodiments, one or more of the alkyl group, alkenyl group, alkynyl group, alkoxyalkyl group, alkoxy group, alkylaminoalkyl group, aromatic and/or aryl group in the formulae may be unsubstituted.

The method used to form the silicon-containing materials and films described herein are deposition processes. Examples of suitable deposition processes for the method disclosed herein include, but are not limited to, plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits silicon containing films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the silicon nitride film is deposited using a plasma enhanced ALD process. In another embodiment, the silicon nitride film is deposited using a plasma enhanced CCVD process. The term "reactor" as used herein, includes without limitation, reaction chamber or deposition chamber. The ALD-like process is defined herein as a cyclic CVD process that provides a high conformal silicon nitride film such as, silicon nitride or silicon carbonitride on a substrate as shown by having at least one of the following: percentage of non-uniformity of about 5% or less as measured by ellipsometer, a deposition rate of 1 Å or greater per cycle, or a combination thereof.

The silicon precursor compounds having Formulae IIA through IID may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In one embodiment of the method described herein, a substrate having a surface to which at least a portion of silicon-containing film or materials is deposited thereupon, is placed into a reactor deposition chamber. The temperature of the substrate may be controlled to be less than the walls of the reactor. The substrate temperature is held at a temperature from about room temperature (e.g., 20° C.) to about 500° C. Alternative ranges for the substrate temperature have one or more of the following end points: 20, 50, 75, 100, 125, 150, 175, 200, 225, 250, 275, 300, 325, 350, 375, 400, 425, 450, 475, and 500° C. Exemplary temperature ranges include the following: 20 to 475° C., 100 to 400° C. or 175 to 350° C.

Depending upon the deposition method, in certain embodiments, the one or more silicon-containing precursor compounds may be introduced into the reactor at a predetermined molar volume, or from about 0.1 to about 1000 micromoles. In this or other embodiments, the silicon precursor or the silicon precursor comprising Formula IIA to IID and a solvent may be introduced into the reactor for a predetermined time period. In certain embodiments, the time period ranges from about 0.001 to about 500 seconds.

In certain embodiments, the silicon-containing films comprise silicon nitride. In these embodiments, the silicon-containing films deposited using the methods described herein are formed in the presence of nitrogen-containing source. A nitrogen-containing source may be introduced into the reactor in the form of at least one nitrogen-containing source and/or may be present incidentally in the other precursors used in the deposition process. Suitable nitrogen-containing source gases may include, for example, ammonia, hydrazine, monoalkylhydrazine, dialkylhydrazine, plasma comprising nitrogen, plasma comprising nitrogen and hydrogen, plasma comprising nitrogen and helium, plasma comprising nitrogen and argon, ammonia plasma, plasma comprising nitrogen and ammonia, plasma comprising ammonia and helium, plasma comprising ammonia and argon plasma, $NF_3$ plasma, organoamine plasma, and mixtures thereof. In other embodiments, the plasma is selected from the group consisting of hydrogen plasma, helium plasma, neon plasma, argon plasma, xenon plasma, hydrogen/helium plasma, hydrogen/argon plasma and mixtures thereof. In one particle embodiment, the nitrogen containing source is substantially free of (e.g., has 2 weight percent (wt. %) or less) hydrogen to avoid introducing additional hydrogen into the final silicon nitride film and is selected from the group consisting of nitrogen plasma, nitrogen/helium, nitrogen/argon plasma. In another embodiment, the nitrogen containing source is selected from monoalkylhydrazine, dialkylhydrazine. For deposition of silicon carbonitride, the nitrogen containing source can be selected from the group consisting of organic amine plasma such as methylamine plasma, dimethylamine plasma, trimethylamine plasma, ethylamine plasma, diethylamine plasma, trimethylamine plasma, ethylenediamine plasma. Throughout the description, the term "organic amine" as used herein describes organic compound has at least one nitrogen atom. Examples of organic amine, but are not limited to, methylamine, ethylamine, propylamine, iso-propylamine, tert-butylamine, sec-butylamine, tert-amylamine, ethylenediamine, dimethylamine, trimethylamine, diethylamine, pyrrole, 2,6-dimethylpiperidine, di-n-propylamine, di-iso-propylamine, ethylmethylamine, N-methylaniline, pyridine, triethylamine. Similarly, throughout the description, the term "organoamino group" as used herein refers to an organic group consisting of at least one nitrogen atom derived from secondary or primary organoamines as described above. "Organoamino group" does not include —$NH_2$ group.

In certain embodiments, the nitrogen-containing source is introduced into the reactor at a flow rate ranging from about 1 to about 2000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds. In yet another embodiment, the purge duration between the pulses that can be as low as 0 seconds or is continuously pulsed without a purge in-between.

In certain embodiments, the silicon-containing films deposited using the methods described herein are formed in the presence of oxygen using an oxygen-containing source, reagent or precursor comprising oxygen. An oxygen-containing source may be introduced into the reactor in the form of at least one oxygen-containing source. In this or other embodiments, the oxygen-containing source may be present incidentally in the other precursors used in the deposition process. Suitable oxygen-containing source gases may include, for example, water ($H_2O$) (e.g., deionized water, purifier water, and/or distilled water), oxygen ($O_2$), oxygen plasma, ozone ($O_3$), NO, $N_2O$, $NO_2$, carbon monoxide (CO), carbon dioxide ($CO_2$) and combinations thereof. In certain embodiments, the oxygen-containing source is introduced into the reactor at a flow rate ranging from about 1 to about 2000 square cubic centimeters (sccm) or from about 1 to about 1000 sccm. The oxygen-containing source can be introduced for a time that ranges from about 0.1 to about 100 seconds. In one particular embodiment, the oxygen-containing source comprises water having a temperature of 10° C. or greater. In embodiments wherein the film is deposited by an ALD or a cyclic CVD process, the precursor pulse can have a pulse duration that is greater than 0.01 seconds, and the oxygen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between. The oxygen-containing source or reagent is provided in a molecular amount less than a 1:1 ratio to the silicon precursor, so that at least some carbon is retained in the as deposited silicon-containing film.

In certain embodiments, the temperature of the reactor in the introducing step is at one or more temperatures ranging from about room temperature (e.g., 20° C.) to about 500° C. Alternative ranges for the substrate temperature have one or more of the following end points: 20, 50, 75, 100, 125, 150, 175, 200, 225, 250, 275, 300, 325, 350, 375, 400, 425, 450, 475, and 500° C. Exemplary temperature ranges include the following: 20 to 475° C., 100 to 400° C. or 175 to 350° C.

Energy is applied to the at least one of the precursor compound, nitrogen-containing source, oxygen-containing source, other reagents, or a combination thereof to induce reaction and to form the silicon-containing film or coating or a chemisorbed layer on at least a portion of the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor. In certain embodiments of the method described herein, the plasma is generated at a power density ranging from about 0.01 to about 1.5 W/cm².

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen-containing source, the nitrogen-containing source, and/or other precursors, source gases, and/or reagents may be performed by changing the time for supplying them to change the stoichiometric composition of the resultant film or material. A flow of argon and/or other gas may be employed as a carrier gas to help deliver the vapor of the at least one precursor compound to the reaction chamber during the precursor pulsing. In certain embodiments, the reaction chamber process pressure is about 10 Torr or less, 5 Torr or less, 2 Torr or less, 1 torr or less.

In one embodiment of the ALD or CCVD method described herein, a substrate is heated on a heater stage in a reaction chamber that is exposed to the precursor compound initially to allow the compound to chemically adsorb onto the surface of the substrate. A purge gas such as nitrogen, argon, or other inert gas purges away unabsorbed excess precursor compound from the process chamber. After sufficient purging, a nitrogen-containing source may be introduced into reaction chamber to react with the absorbed surface followed by another gas purge to remove reaction by-products from the chamber. The process cycle can be repeated to achieve the desired film thickness. In other embodiments, pumping under vacuum can be used to remove unabsorbed excess precursor compound from the process chamber, after sufficient evacuation under pumping, a nitrogen-containing source may be introduced into reaction chamber to react with the absorbed surface followed by another pumping down purge to remove reaction by-products from the chamber. In yet another embodiment, the precursor compound and the nitrogen-containing source can be co-flowed into reaction chamber to react on the substrate surface to deposit silicon nitride. In a certain embodiment of cyclic CVD, the purge step is not used.

In this or other embodiments, it is understood that the steps of the methods described herein may be performed in a variety of orders, may be performed sequentially or concurrently (e.g., during at least a portion of another step), and any combination thereof. The respective step of supplying the precursors and the nitrogen-containing source gases may be performed by varying the duration of the time for supplying them to change the stoichiometric composition of the resulting silicon-containing film.

In one aspect, there is provided a method of forming a silicon nitride film, the method comprising the steps of:

a. providing a substrate in a reactor;

b. introducing into the reactor an at least one silicon precursor compound selected from the group consisting of:

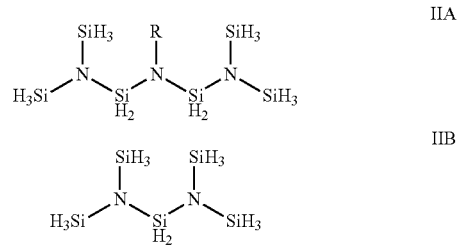

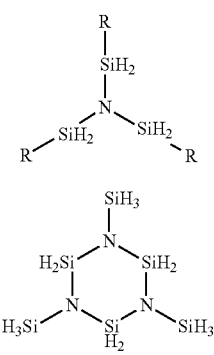

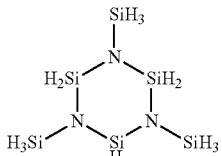

wherein substituent R is independently selected from a hydrogen, a halide atom, a linear $C_1$ to $C_{10}$ alkyl group; a branched $C_3$ to $C_{10}$ alkyl group; a linear or branched $C_3$ to $C_{12}$ alkenyl group; a linear or branched $C_3$ to $C_{12}$ alkenyl group; a linear or branched $C_3$ to $C_{12}$ alkynyl group; a $C_4$ to $C_{10}$ cyclic alkyl group; and a $C_6$ to $C_{10}$ aryl group wherein at least a portion of the compound reacts under processing conditions sufficient to provide a chemisorbed layer;

c. purging the reactor with a purge gas;

d. introducing a plasma comprising nitrogen into the reactor to react with at least a portion of the chemisorbed layer and provide at least one reactive site; and e. optionally purge the reactor with an inert gas; and wherein the steps b through e are repeated until a desired thickness of the silicon nitride film is obtained.

The silicon precursors described herein and compositions comprising the silicon precursors having three or more Si—N bonds, and optionally three or more Si—$H_3$ groups represented by Formulae IIA through IID, according to the present invention are preferably substantially free of halide ions such as chloride or metal ions such as Al. As used herein, the term "substantially free" as it relates to halide ions (or halides) such as, for example, chlorides and fluorides, bromides, iodides, $Al^{3+}$ ions, $Fe^{2+}$, $Fe^{3+}$, $Ni^{2+}$, $Cr^{3+}$ means less than 5 ppm (by weight), preferably less than 3 ppm, and more preferably less than 1 ppm, and most preferably 0 ppm. Chlorides or metal ions are known to act as decomposition catalysts for silicon precursors. Significant levels of chloride in the final product can cause the silicon precursors to degrade. The gradual degradation of the silicon precursors may directly impact the film deposition process making it difficult for the semiconductor manufacturer to meet film specifications. In addition, the shelf-life or stability is negatively impacted by the higher degradation rate of the silicon precursors thereby making it difficult to guarantee a 1-2 year shelf-life. Moreover, silicon precursors are known to form flammable and/or pyrophoric gases upon decomposition such as hydrogen and silane. Therefore, the accelerated decomposition of the silicon precursors presents safety and performance concerns related to the formation of these flammable and/or pyrophoric gaseous byproducts.

Compositions according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodisilanes, bromodisilanes, or iododisilanes thereby avoiding the production of by-products that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and, may include, but are not limited to purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available MgO—$Al_2O_3$ blends can be used to remove halides such as chloride.

For those embodiments relating to a composition comprising a solvent(s) and a silicon precursor having Formulae IIA through IID described herein, the solvent or mixture thereof selected does not react with the silicon precursors. The amount of solvent by weight percentage in the composition ranges from 0.5% by weight to 99.5% or from 10% by weight to 75%. In this or other embodiments, the solvent has a boiling point (b.p.) similar to the b.p. of the silicon precursor precursors of Formula II or the difference between the b.p. of the solvent and the b.p. of the silicon precursor precursors of Formula II is 40° C. or less, 30° C. or less, or 20° C. or less, 10° C. or less, or 5° C. or less. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof. Some non-limiting exemplary compositions include, but not limited to, a composition comprising bis(disilylamino)silane (b.p. about 135° C.) and octane (b.p. 125 to 126° C.); a composition comprising bis(disilylamino)silane (b.p. about 135° C.) and ethylcyclohexane (b.p. 130-132° C.); a composition comprising bis(disilylamino)silane (b.p. about 135° C.) and cyclooctane (b.p. 149° C.); a composition comprising bis(disilylamino)silane (b.p. about 135° C.), and toluene (b.p. 115° C.).

In another embodiment, a vessel for depositing a silicon-containing film comprising one or more silicon precursor compound having Formulae IIA through IID is described herein. In one particular embodiment, the vessel comprises at least one pressurizable vessel (preferably of stainless steel) fitted with the proper valves and fittings to allow the delivery of one or more precursors to the reactor for a CVD or an ALD process. In this or other embodiments, the silicon precursor compound is provided in a pressurizable vessel comprised of stainless steel and the purity of the silicon precursor is 98% by weight or greater or 99.5% or greater which is suitable for the majority of semiconductor applications. In certain embodiments, such vessels can also have means for mixing the precursors with one or more additional precursor if desired. In these or other embodiments, the contents of the vessel(s) can be premixed with an additional precursor. Alternatively, the silicon precursor compounds described herein and/or other precursor can be maintained in separate vessels or in a single vessel having separation means for maintaining the silicon precursor having Formulae IIA through IID and other precursor separate during storage.

In certain embodiments, the method described herein further comprises one or more additional silicon-containing precursors other than the silicon precursors having the above Formulae IIA through IID. Examples of additional silicon-containing precursors include, but are not limited to, mono-aminosilane (e.g., di-iso-propylaminosilane, di-sec-butylaminosilane, phenylmethylaminosilane; organo-silicon compounds such as trisilylamine (TSA); monoaminosilane (di-iso-propylaminosilane, di-sec-butylaminosilane, phenylmethylaminosilane); siloxanes (e.g., hexamethyl disiloxane (HMDSO) and dimethyl siloxane (DMSO)); organosilanes (e.g., methylsilane, dimethylsilane, diethylsilane, vinyl trimethylsilane, trimethylsilane, tetramethylsilane, ethylsilane, disilylmethane, 2,4-disilapentane, 1,4-disilabutane, 2,5-disilahexane, 2,2-disilylpropane, 1,3,5-trisilacyclohexane and fluorinated derivatives of these compounds); phenyl-containing organo-silicon compounds (e.g., dimethylphenylsilane and diphenylmethylsilane); oxygen-containing organo-silicon compounds ,e.g., dimethyldimethoxysilane; 1,3,5,7-tetramethylcyclotetrasiloxane; 1,1,3,3-tetramethyldisiloxane; 1,3,5,7-tetrasila-4-oxo-heptane; 2,4,6,8-tetrasila-3,7-dioxo-nonane; 2,2-dimethyl-2,4,6,8-tetrasila-3,7-dioxo-nonane; octamethylcyclotetrasiloxane; [1,3,5,7,9]-pentamethylcyclopentasiloxane; 1,3,5,7-tetrasila-2,6-dioxo-cyclooctane; hexamethylcyclotrisiloxane; 1,3-dimethyldisiloxane; 1,3,5,7,9-pentamethylcyclopentasiloxane; hexamethoxydisiloxane, and fluorinated derivatives of these compounds.

In certain embodiments, the silicon precursors having Formulae IIA through IID described herein can also be used as a dopant for metal containing films, such as but not limited to, metal oxide films or metal nitride films. In these embodiments, the metal containing film is deposited using an ALD or CVD process such as those processes described herein using metal alkoxide, metal amide, or volatile organometallic precursors. Examples of suitable metal alkoxide precursors that may be used with the method disclosed herein include, but are not limited to, group 3 to 6 metal alkoxide, group 3 to 6 metal complexes having both alkoxy and alkyl substituted cyclopentadienyl ligands, group 3 to 6 metal complexes having both alkoxy and alkyl substituted pyrrolyl ligands, group 3 to 6 metal complexes having both alkoxy and diketonate ligands; group 3 to 6 metal complexes having both alkoxy and ketoester ligands; Examples of suitable metal amide precursors that may be used with the method disclosed herein include, but are not limited to, $AlCl_3$, trimethylaluminum (TMA), triethylaluminum (TEA), methylaluminum chloride, tris(dimethylamino)aluminum (TDMAA), tris(dimethylamino)aluminum (TDMAA), and tris(diethylamino)aluminum (TDEAA), and other volatile aluminum precursors, tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), tetrakis(dimethylamino)titanium (TDMAT), tetrakis(diethylamino)titanium (TDEAT), tetrakis(ethylmethylamino)titanium (TEMAT), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, bis(tert-butylimino)bis(dimethylamino)tungsten (BTBMW), bis(tert-butylimino)bis(diethylamino)tungsten, bis(tert-butylimino)bis(ethylmethylamino)tungsten, and combinations thereof. Examples of suitable organometallic precursors that may be used with the method disclosed herein include, but are not limited to, group 3 metal cyclopentadienyls or alkyl cyclopentadienyls. Exemplary Group 3 to 6 metal herein include, but not limited to, Y, La, Ce, Pr, Nd, Sm, Eu, Gd, Tb, Dy, Er, Yb, Lu, Ti, Hf, Zr, V, Nb, Ta, Cr, Mo, and W.

As mentioned previously, the method described herein may be used to deposit a silicon nitride film on at least a portion of a substrate. Examples of suitable substrates include but are not limited to, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, anti reflective coatings, photoresists, a flexible substrate such as IGZO, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nano-electromechanical systems, thin film transistor (TFT), light emitting diodes (LED), organic light emitting diodes (OLED), IGZO, and liquid crystal displays (LCD).

In certain embodiments, the substrate has a surface feature. In one particular embodiment, the substrate optionally has features on it of a small size less than 100 μm in width preferably less than 1 μm in width and most preferably less than 0.5 μm in width. The aspect ratio (the depth to width ratio) of the features, if present, is greater than 1:1 and preferably greater than 4:1 and most preferably greater than 8:1.

The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

The following examples illustrate the method for depositing silicon-containing materials or films described herein and are not intended to limit it in any way.

WORKING EXAMPLES

In the following examples, unless stated otherwise, properties were obtained from sample films that were deposited onto medium resistivity (14-17 Ω-cm) single crystal silicon wafer substrates. All film depositions were performed using the CN-1 reactor which has a showerhead design and uses 13.56 MHz direct plasma or the cross flow type CN-1 reactor without plasma (for comparative examples). In typical process conditions, unless stated otherwise, the chamber pressure was fixed at a pressure ranging from about 1 to about 5 torr. Additional inert gas such as argon or nitrogen was used to maintain chamber pressure. Typical RF power used was 125 W over electrode area of 150 mm wafer susceptor to provide a power density of 0.7 W/cm$^2$.

Example 1

Synthesis of Bis(disilylamino)silane (aka N,N'-disilyltrisilazane Formula IIB)

Under the protection of nitrogen, 2.5 grams of a solution of $B(C_6F_5)_3$ in dodecane (0.2 weight (wt. %), $9.8 \times 10^{-6}$ moles (mol)) was added to a 1 liter (L) round bottomed flask containing trisilylamine (500 g, 4.66 moles (mol)). Silane gas immediately began to evolve as gas bubbles. The reaction solution was stirred for approximately 1 hour while maintaining an internal temperature of 20° C. Once the mass of the reaction solution had decreased by 30%, 4,4-bipyridine was added (1.25 g, $8.00 \times 10^{-3}$ moles) as a catalyst poison, and the bubbling quickly stopped. After stirring the quenched reaction mixture for 2 h, the volatiles were vacuum transferred (25-35° C./1 Torr) into a second 1 L flask chilled to −78° C. The collected crude liquid was determined by gas chromatography (GC) and gas chromatography-mass spectroscopy (GC-MS) to be a ~1:1 mixture of trisilylamine and N,N'-disilyltrisilazane. Purification by fractional vacuum-distillation (58° C./50 Torr) yielded 164 g of N,N'-disilyltrisilazane as a colorless liquid with a purity of >99%. boiling point (b.p.)=135° C. GC-MS showed the following mass peaks: 181 (M−1), 149, 119, 104, 91, 72.

Example 2

PEALD Silicon Nitride Film Using Bis(disilylamino)silane (aka N,N'-disilyltrisilazane, Formula IIB) and Nitrogen Plasma The silicon wafer was loaded into the CN-1 reactor equipped with showerhead design with 13.56 MHz direct plasma and heated to 300° C. with chamber pressure of 2 torr. Bis(disilylamino)silane was used as silicon precursor and nitrogen plasma as plasma source. The ALD cycle was conducted using the following process parameters.
  a. Prepare the reactor and load wafer
     Chamber pressure: 2 torr
  b. Introduce a silicon precursor to the reactor
     Total flow of nitrogen: 1000 standard cubic centimeters (sccm)
     silicon precursor pulse: 1 second
  c. Purge
     Total flow of nitrogen: 1000 sccm
     Purge time: 10 seconds
  d. Introduce plasma
     Total flow of nitrogen: 1000 sccm
     Plasma power: 125 W
     Plasma pulse: 10 second
  e. Purge
     Total flow of nitrogen: 1000 sccm
     Purge time: 10 seconds Steps b to e were repeated for 300 cycles. The refractive index of the resulting silicon nitride film was 2.0 whereas the growth per cycle (GPC) was about 0.90 Å/cycle, demonstrating high quality silicon nitride can be achieved using the bis(disilylamino)silane precursor compound.

Figure 2:
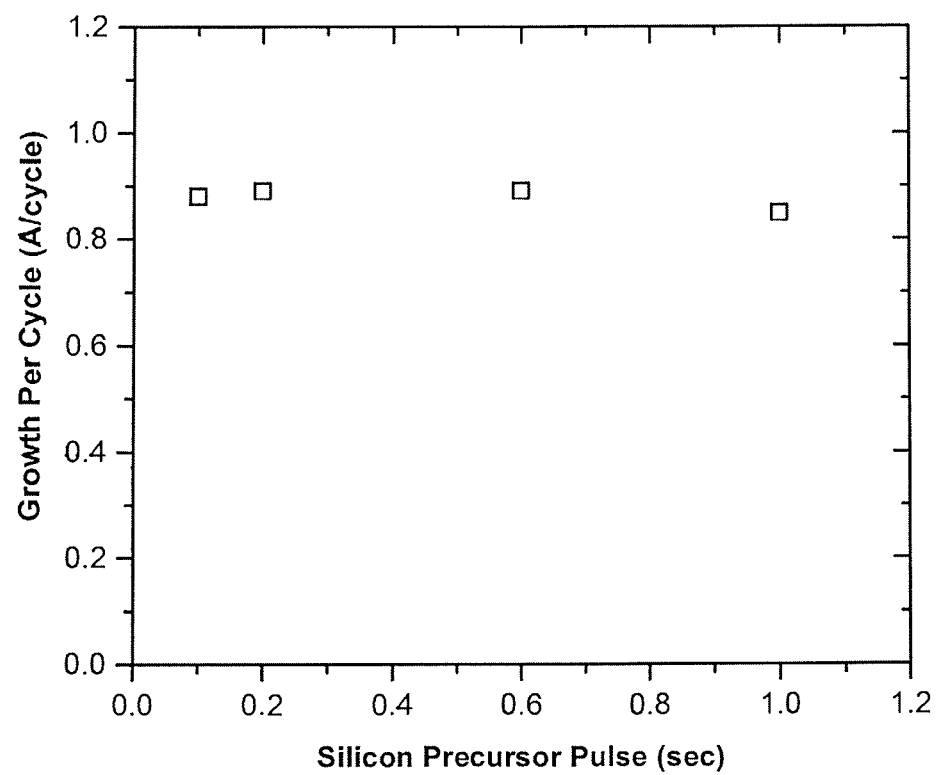
FIG. 2 provides the relationship between the growth of deposited film thickness measured in Å/cycle and silicon precursor pulse time (measured in seconds) for the precursor compound and method described in Example 2.
Figure 3:
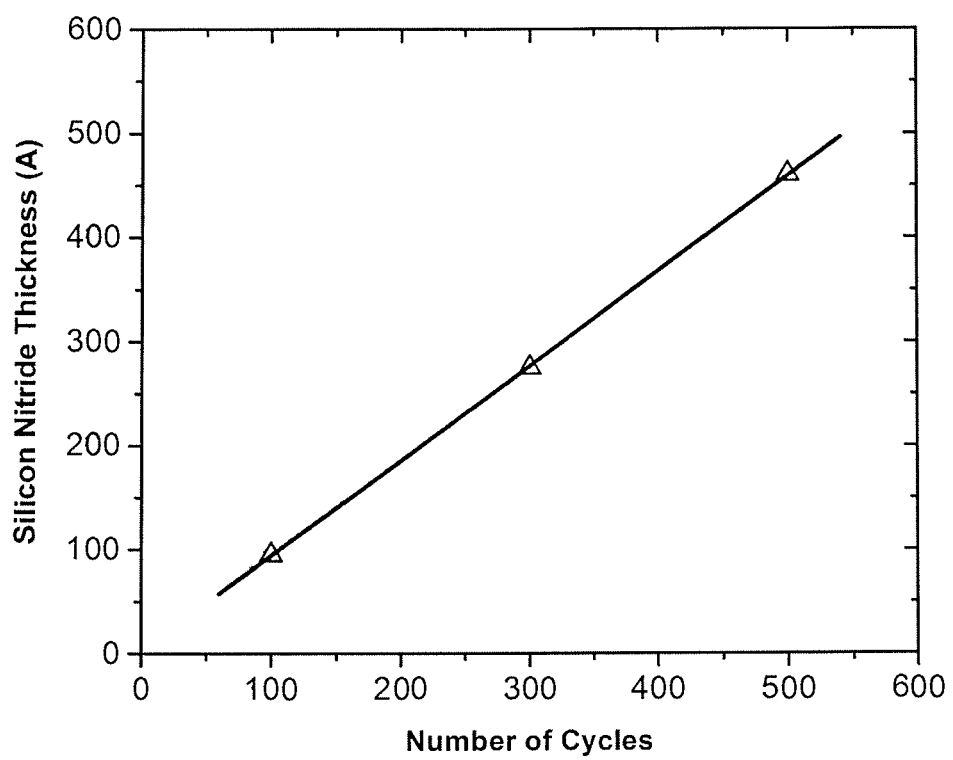
FIG. 3 provides the silicon nitride film thickness measured in Å versus the number of cycles using Formula IIB precursor and nitrogen plasma at 300° C. described in Example 2.

Additional experiments were designed to further confirm the PEALD behavior of bis(disilylamino)silane as silicon precursor. FIG. 1 shows the temperature dependence of the plasma enhanced atomic layer deposition of silicon nitride using Formula IIB precursor and nitrogen plasma, indicating that ALD window for this precursor is at least up to ~400° C. FIG. 2 shows the film thickness of as-deposited silicon nitride vs pulse time of Formula IIB precursor using nitrogen plasma at 300° C., demonstrating the self-limiting behavior even at 0.1 s and suggesting high reactivity of Formula IIB precursor. FIG. 3 shows the film thickness of as-deposited silicon nitride vs the number of cycles using Formula IIB precursor and nitrogen plasma at 300° C., demonstrating the growth per cycle is about 0.9 Å/cycle.

In a further experiment, steps b to e were repeated for 300 cycles except that the plasma power in step d was set to 250 Watts. The resultant film thickness of silicon nitride was 230 Å, corresponding to a growth per cycle (GPC) of 0.77 Å/cycle. The refractive index of the silicon nitride film was 2.0.

Example 3

PEALD Silicon Nitride Film Using Bis(disilylamino)silane (aka N,N'-disilyltrisilazane, Formula IIB) and Ammonia Plasma The silicon wafer was loaded into the CN-1 reactor equipped with showerhead design with 13.56 MHz direct plasma and heated to 300° C. with chamber pressure of 2 torr. Bis(disilylamino)silane was used as silicon precursor and ammonia plasma as plasma source. The ALD cycle was conducted using the following process parameters.
  a. Prepare the reactor and load wafer
     Chamber pressure: 2 torr
  b. Introduce a silicon precursor to the reactor
     Total flow of argon: 1000 sccm
     silicon precursor pulse: 0.2 second
  c. Purge
     Total flow of argon: 1000 sccm
     Purge time: 10 seconds
  d. Introduce plasma
     Total flow of argon: 1000 sccm
     Total flow of ammonia: 500 sccm
     Plasma power: 125 W
     Plasma pulse: 10 second
  e. Purge
     Total flow of nitrogen: 1000 sccm
     Purge time: 10 seconds Steps b to e were repeated for 300 cycles. The thickness of the as deposited silicon nitride was about 29 Å, suggesting that the ammonia plasma is not as good of a nitrogen source compared to nitrogen plasma under similar conditions such as those in Example 2.

Comparable Example 3

Thermal ALD Silicon Nitride Film Using Bis(disilylamino)silane (aka N,N'-disilyltrisilazane, Formula IIB) and Ammonia The silicon wafer was loaded into the CN-1 reactor equipped with showerhead design with 13.56 MHz direct plasma and heated to 350° C. with chamber pressure of 2 torr. Bis(disilylamino)silane was used as the silicon precursor. The ALD cycle was conducted using the following process parameters.
  a. Prepare the reactor and load wafer
     Chamber pressure: 2 torr
  b. Introduce a silicon precursor to the reactor
     Total flow of argon: 1000 sccm
     silicon precursor pulse: 0.2 second
  c. Purge
     Total flow of argon: 1000 sccm
     Purge time: 10 seconds
  d. Introduce ammonia
     Total flow of argon: 1000 sccm
     Total flow of ammonia: 500 sccm
     Pulse: 10 second
  e. Purge
     Total flow of argon: 1000 sccm
     Purge time: 10 seconds
Steps b to e were repeated for 200 cycles. No deposition was observed on the substrate when a plasma was not used compared to Example 3.

Example 4

PEALD Silicon Nitride Film Using Bis(disilylamino)silane (aka N,N'-disilyltrisilazane, Formula IIB) and Hydrogen/Nitrogen Plasma The silicon wafer was loaded into the CN-1 reactor equipped with showerhead design with 13.56 MHz direct plasma and heated to 300° C. with chamber pressure of 2 torr. Bis(disilylamino)silane was used as silicon precursor and nitrogen plasma as plasma source. The ALD cycle was conducted using the following process parameters.
  a. Prepare the reactor and load wafer
     Chamber pressure: 2 torr
  b. Introduce a silicon precursor to the reactor
     Total flow of nitrogen: 1000 sccm
     silicon precursor pulse: 0.2 second
  c. Purge
     Total flow of nitrogen: 1000 sccm
     Purge time: 10 seconds
  d. Introduce plasma
     Total flow of nitrogen: 1000 sccm
     Total flow of hydrogen: 500 sccm
     Plasma power: 125 W
     Plasma pulse: 10 second
  e. Purge
     Total flow of nitrogen: 1000 sccm
     Purge time: 10 seconds
Steps b to e were repeated for 300 cycles. The thickness of as deposited silicon nitride was about 45 Å, corresponding a GPC of 0.15 Å/cycle. This experiment suggests hydrogen/nitrogen plasma is not a good nitrogen source compared to nitrogen plasma under the similar conditions such as Example 2.

Example 5

PEALD Silicon Nitride Film Using Bis(disilylamino)silane (aka N,N'-disilyltrisilazane) Formula IIB and Hydrogen/Nitrogen Plasma The silicon wafer was loaded into the CN-1 reactor equipped with showerhead design with 13.56 MHz direct plasma and heated to 300° C. with chamber pressure of 2 torr. Bis(disilylamino)silane was employed as silicon precursor and nitrogen plasma as plasma source. The ALD cycle was conducted using the following process parameters.
  a. Prepare the reactor and load wafer
     Chamber pressure: 2 torr
  b. Introduce a silicon precursor to the reactor
     Total flow of nitrogen: 500 sccm
     Total flow of hydrogen: 500 sccm
     silicon precursor pulse: 0.2 second
  c. Purge
     Total flow of nitrogen: 500 sccm
     Total flow of hydrogen: 500 sccm
     Purge time: 10 seconds
  d. Introduce plasma
     Total flow of nitrogen: 500 sccm
     Total flow of hydrogen: 500 sccm
     Plasma power: 125 W
     Plasma pulse: 10 second
  e. Purge
     Total flow of nitrogen: 1000 sccm
     Purge time: 10 seconds
Steps b to e were repeated for 300 cycles. The thickness of as deposited silicon nitride was about 57 Å, corresponding a GPC of 0.19 Å/cycle. This experiment suggests changing the ratio of hydrogen vs nitrogen can improve the deposition rate of silicon nitride, however growth per cycle is still much lower than nitrogen plasma shown in Example 2. Another experiment was conducted using 1 sec pulse for the silicon precursor in step b, the thickness of as deposited silicon nitride was about 72 Å, corresponding a GPC of 0.24 Å/cycle.

The invention claimed is:

1. A composition for depositing a silicon nitride or silicon oxide film, the composition comprising:
   at least one silicon precursor compound selected from the group consisting of Formula IIA, Formula IIB, and Formula IID:

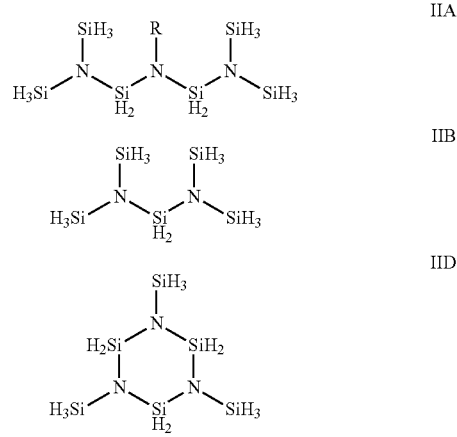

wherein substituent R is independently selected from a halide atom, a linear $C_1$ to $C_{10}$ alkyl group; a branched $C_3$ to $C_{10}$ alkyl group, a linear or branched $C_3$ to $C_{12}$ alkenyl group, a linear or branched $C_3$ to $C_{12}$ alkenyl group, a linear or branched $C_3$ to $C_{12}$ alkynyl group, a $C_4$ to $C_{10}$ cyclic alkyl group, and a $C_6$ to $C_{10}$ aryl group.

2. The composition of claim 1 wherein the at least one silicon precursor compound is at least one compound represented by Formula IIB.

3. A composition for forming a silicon-containing material:
(a) at least one silicon precursor compound having the following Formulae IIA through IID:

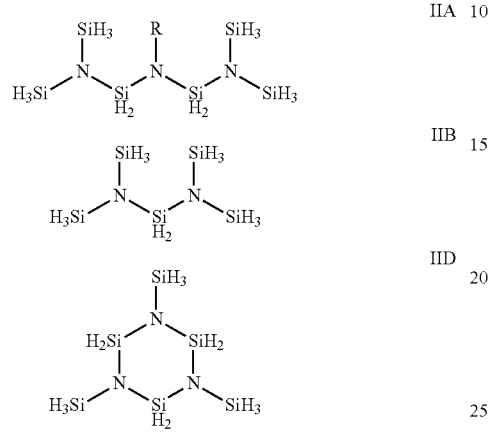
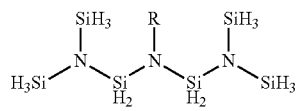
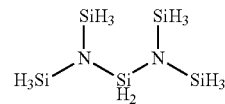
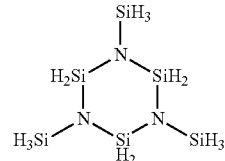

wherein substituent R is independently selected from a halide atom, a linear $C_1$ to $C_{10}$ alkyl group, a branched $C_3$ to $C_{10}$ alkyl group, a linear or branched $C_3$ to $C_{12}$ alkenyl group, a linear or branched $C_3$ to $C_{12}$ alkenyl group, a linear or branched $C_3$ to $C_{12}$ alkynyl group, a $C_4$ to $C_{10}$ cyclic alkyl group, and a $C_6$ to $C_{10}$ aryl group; and
(b) a solvent wherein the solvent has a boiling point and the difference between the boiling point of the solvent and a boiling point of the silicon precursor is 40° C. or less.

4. The composition of claim 3 wherein the solvent is at least one selected from the group consisting of ether, tertiary amine, alkyl hydrocarbon, aromatic hydrocarbon, and tertiary aminoether.

5. The composition of claim 3 wherein the solvent is at least one selected from the group consisting of octane, ethylcyclohexane, cyclooctane, and toluene.

6. The composition of claim 1 or 3 wherein the at least one silicon precursor compound is bis(disilylamino)silane.

7. A method for depositing a silicon nitride film on at least a portion of a surface of a substrate, the method comprising:
placing the substrate into a reactor;
introducing into the reactor at least one silicon precursor compound selected from the group consisting of Formula IIA, Formula IIB, and Formula IID:

wherein substituent R is independently selected from a halide atom, a linear $C_1$ to $C_{10}$ alkyl group, a branched $C_3$ to $C_{10}$ alkyl group, a linear or branched $C_3$ to $C_{12}$ alkenyl group, a linear or branched $C_3$ to $C_{12}$ alkenyl group, a linear or branched $C_3$ to $C_{12}$ alkynyl group, a $C_4$ to $C_{10}$ cyclic alkyl group, and a $C_6$ to $C_{10}$ aryl group, under conditions sufficient to provide a chemisorbed layer;
c. purging the reactor with a purge gas;
d. introducing a plasma source comprising nitrogen into the reactor to react with at least a portion of the chemisorbed layer; and
e. optionally purge the reactor with an inert gas; and wherein the steps b through e are repeated until a desired thickness of the silicon nitride film is obtained.

8. The method of claim 7 wherein the plasma source is selected from the group consisting of nitrogen plasma, nitrogen/helium plasma, nitrogen/argon plasma, ammonia plasma, ammonia/helium plasma, ammonia/argon/plasma, helium plasma, argon plasma, hydrogen plasma, hydrogen/helium plasma, hydrogen/argon plasma, organic amine plasma, and mixtures thereof.

9. The method of claim 7 wherein the at least one silicon precursor compound comprises bis(disilylamino)silane.

10. The method of claim 7 wherein the plasma in step d is generated at a power density ranging from about 0.01 to about 1.5 W/cm².

11. The method of claim 7 wherein the at least one silicon precursor compound is at least one compound represented by Formula IIB.

* * * * *